United States Patent
Fujikawa et al.

(10) Patent No.: US 12,387,934 B2
(45) Date of Patent: Aug. 12, 2025

(54) METHOD OF MANUFACTURING SEMICONDUCTOR ELEMENT

(71) Applicant: Mitsubishi Electric Corporation, Tokyo (JP)

(72) Inventors: Masahiro Fujikawa, Tokyo (JP); Eiji Yagyu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 433 days.

(21) Appl. No.: 17/912,053

(22) PCT Filed: Apr. 13, 2020

(86) PCT No.: PCT/JP2020/016312
§ 371 (c)(1),
(2) Date: Sep. 16, 2022

(87) PCT Pub. No.: WO2021/210047
PCT Pub. Date: Oct. 21, 2021

(65) Prior Publication Data
US 2023/0134255 A1 May 4, 2023

(51) Int. Cl.
*H01L 21/18* (2006.01)
*H01L 21/304* (2006.01)
(Continued)

(52) U.S. Cl.
CPC .......... *H01L 21/185* (2013.01); *H01L 21/304* (2013.01); *H10D 30/015* (2025.01); *H10D 62/8503* (2025.01)

(58) Field of Classification Search
CPC . H01L 21/185; H01L 21/304; H01L 29/2003; H01L 29/66462; H01L 21/78;
(Continued)

(56) References Cited

U.S. PATENT DOCUMENTS

| 6,593,213 B2 * | 7/2003 | Stanbery ............. H01L 31/0322 438/455 |
| 10,672,945 B2 * | 6/2020 | Kawaguchi ........... H01L 33/007 |
| 2007/0082467 A1 * | 4/2007 | Hata ................... H01L 21/2007 438/483 |

FOREIGN PATENT DOCUMENTS

| JP | 11-74230 A | 3/1999 |
| JP | 2005-129825 A | 5/2005 |

(Continued)

OTHER PUBLICATIONS

Office Action issued Feb. 1, 2024 in Korean Patent Application No. 10-2022-7032511, 13 pages.

(Continued)

*Primary Examiner* — Vu A Vu
(74) *Attorney, Agent, or Firm* — XSENSUS LLP

(57) ABSTRACT

It is an object of the present disclosure to provide a method of manufacturing a thin semiconductor element having a low defect rate. A method of manufacturing a semiconductor element according to the present disclosure includes: forming a metal thin film on an electrode protection layer of a circuit element substrate and a support substrate in vacuum; attaching the metal thin film of the circuit element substrate and the metal thin film of the support substrate by an atomic diffusion joining method; removing a semiconductor substrate by polishing to expose a circuit element; joining a transfer substrate to an exposed surface of the circuit element; and detaching the support substrate from the circuit element after joining the transfer substrate.

7 Claims, 6 Drawing Sheets

(51) Int. Cl.
*H10D 30/01* (2025.01)
*H10D 62/85* (2025.01)

(58) Field of Classification Search
CPC . H01L 2221/68318; H01L 2221/68327; H01L 2221/6834; H01L 2221/68381; H01L 21/6835
USPC ........................................................ 438/478
See application file for complete search history.

(56) References Cited

FOREIGN PATENT DOCUMENTS

| | | | |
|---|---|---|---|
| JP | 2007-324406 | A | 12/2007 |
| JP | 2012-28477 | A | 2/2012 |
| KR | 10-2019-0142382 | A | 12/2019 |
| KR | 10-2020-0026822 | A | 3/2020 |

OTHER PUBLICATIONS

International Search Report and Written Opinion mailed on Jun. 30, 2020, received for PCT Application PCT/JP2020/016312, filed on Apr. 13, 2020, 10 pages including English Translation.

* cited by examiner

METHOD OF MANUFACTURING SEMICONDUCTOR ELEMENT

CROSS-REFERENCE TO RELATED APPLICATION

The present application is based on PCT filing PCT/JP2020/016312, filed Apr. 13, 2020, the entire contents of which are incorporated herein by reference.

TECHNICAL FIELD

The present disclosure relates to a method of manufacturing a semiconductor element.

BACKGROUND ART

Conventionally required is reduction in a thickness of a semiconductor element (also referred to as thinning) to pack the semiconductor element at a high density and downsize a semiconductor module or to join a heat radiation substrate to the semiconductor element and increase performance. Thinning of the semiconductor element is performed by the following processes. Firstly, a circuit element surface of the semiconductor element is bonded to a support substrate, and a surface on a side opposite to the circuit element surface is mechanically and chemically polished. Next, the support substrate is detached from the semiconductor element. A crack or damage on the thinned semiconductor element needs to be prevented in these processes.

Patent Document 1 discloses a method of bonding a semiconductor substrate having a thickness of 1130 μm to a support substrate by an electron wax, polishing a back surface of the semiconductor substrate, joining a transfer substrate to the back surface of the semiconductor substrate, and heating them to detach the support substrate.

Patent Document 2 discloses a method of removing a substrate not by polishing but etching. Particularly, an organic insulating film is applied on a semiconductor layer on an Si substrate except for an end portion of a wafer made up of the Si substrate and the semiconductor layer. Next, an inorganic insulating film is formed to cover the organic insulating film. Subsequently, surfaces of the wafer and a support substrate are activated in vacuum, and the wafer is attached to the support substrate. Subsequently, an Si substrate is removed by etching.

Patent Document 3 describes a method of manufacturing a semiconductor element having a chip-on-chip structure. In the manufacturing method in Patent Document 3, a semiconductor wafer includes an Si substrate and an element layer on the Si substrate. A through electrode extending to both the Si substrate and the element layer is formed. A metal layer of the semiconductor wafer is attached to a metal layer of a support substrate after an insulating film and a metal film are sequentially formed on the element layer. A back surface of the wafer is polished until the through electrode is exposed from the back surface, the support substrate is removed by polishing and etching.

PRIOR ART DOCUMENTS

Patent Documents

Patent Document 1: Japanese Patent Application Laid-Open No. 2005-129825
Patent Document 2: Japanese Patent Application Laid-Open No. 2012-028477
Patent Document 3: Japanese Patent Application Laid-Open No. 2007-324406

SUMMARY

Problem to be Solved by the Invention

In the conventional methods described in Patent Documents 1 to 3, a substrate including a circuit element can be thinned to some degree of thickness. However, when the substrate on the back surface is wholly removed to thin the circuit element to 10 μm or less, the substrate which has supported the circuit element does not exist, thus there is a problem that strength of the semiconductor element decreases, a defect such as a crack, breakage, or film detachment occurs in the semiconductor element at a time of polishing, dicing, or detaching the support substrate, and a defect rate increases.

The present disclosure therefore has been made to solve the above problems, and it is an object to provide a method of manufacturing a thin semiconductor element having a low defect rate.

Means to Solve the Problem

A method of manufacturing a semiconductor element according to the present disclosure includes: preparing a circuit element substrate including a semiconductor substrate and a circuit element on the semiconductor substrate; forming an electrode protection layer on the circuit element; preparing a support substrate; forming a metal thin film on the electrode protection layer of the circuit element substrate and the support substrate in vacuum; attaching the metal thin film of the circuit element substrate and the metal thin film of the support substrate by an atomic diffusion joining method, thereby joining the circuit element substrate and the support substrate; removing the semiconductor substrate by polishing to expose the circuit element; joining a transfer substrate to an exposed surface of the circuit element; and detaching the support substrate from the circuit element after joining the transfer substrate.

Effects of the Invention

According to the method of manufacturing the semiconductor element according to the present disclosure, a thin semiconductor element in which a crack, detachment, or breakage hardly occurs in a circuit element even when a semiconductor substrate is removed by polishing and having a low defect rate can be manufactured. These and other objects, features, aspects and advantages of the present disclosure will become more apparent from the following detailed description when taken in conjunction with the accompanying drawings.

DESCRIPTION OF EMBODIMENT(S)

A. Embodiment 1

A-1. Configuration

Figure 1:
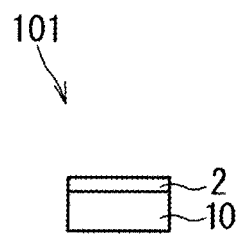
FIG. 1 A cross-sectional view illustrating a semiconductor element according to an embodiment 1.

FIG. 1 is a cross-sectional view illustrating a configuration of a semiconductor element 101 according to an embodiment 1. The semiconductor element 101 includes a circuit element 2 and a transfer substrate 10. The transfer substrate 10 is joined to a lower surface of the circuit element 2. In the description hereinafter, the circuit element 2 is a high electron mobility transistor (HEMT) having gallium nitride (GaN) as a semiconductor layer, but may be the other circuit element such as a metal-oxide-semiconductor field-effect transistor (MOSFET) or an insulated gate bipolar transistor (IGBT). A thickness of the circuit element 2 is 10 μm, for example. The transfer substrate 10 is a substrate having high thermal conductivity, and is a diamond substrate, for example.

A-2. Manufacturing Process

Figure 2:
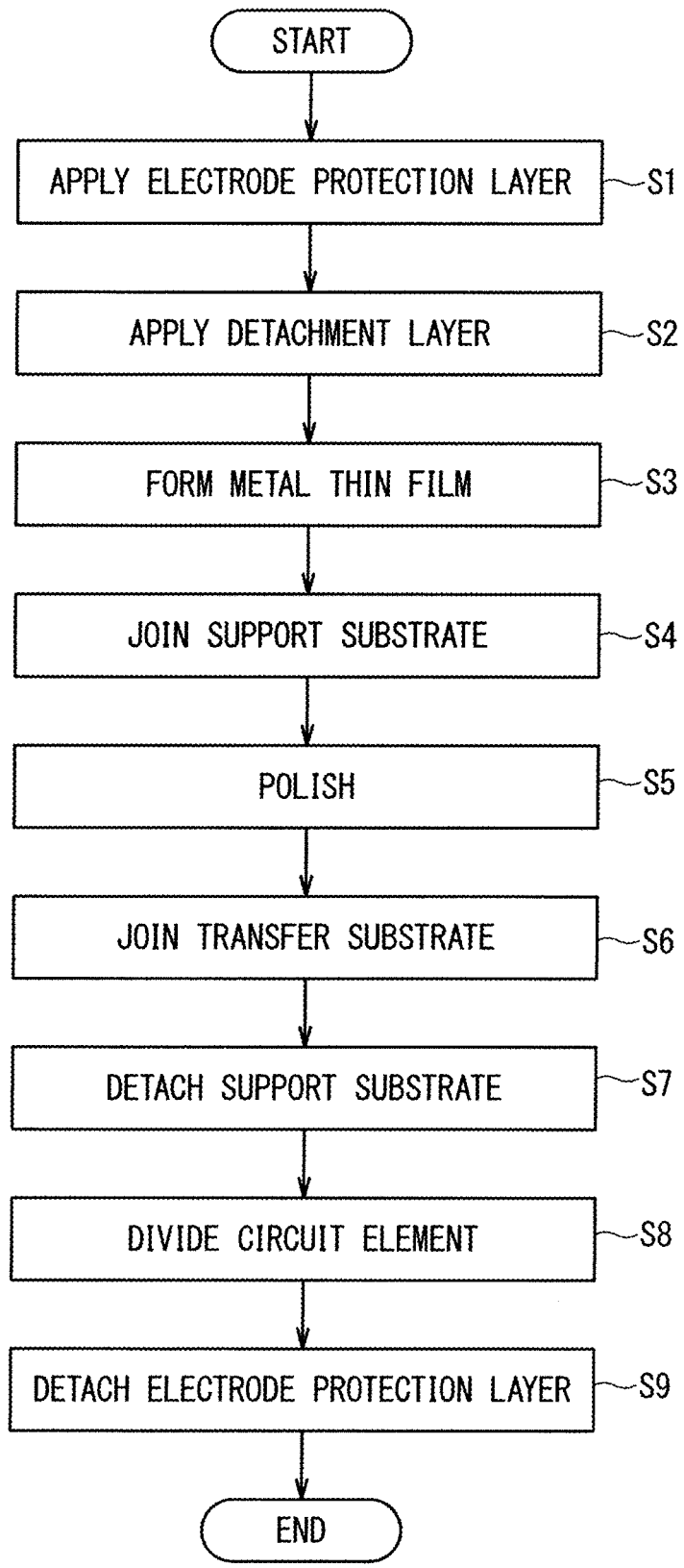
FIG. 2 A flow chart illustrating a method of manufacturing the semiconductor element according to the embodiment 1.

FIG. 2 is a flow chart illustrating a method of manufacturing the semiconductor element 101. The method of manufacturing the semiconductor element 101 is described in accordance with a flow in FIG. 2.

Figure 3:
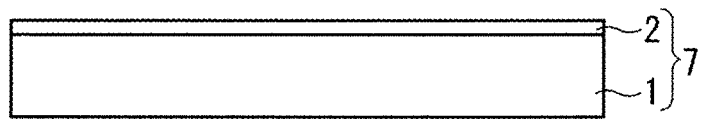
FIG. 3 A cross-sectional view illustrating the method of manufacturing the semiconductor element according to the embodiment 1.

Firstly, a circuit element substrate 7 is prepared as illustrated in FIG. 3. The circuit element substrate 7 includes a semiconductor substrate 1 and a circuit element 2 formed on the semiconductor substrate 1. The semiconductor substrate 1 is an Si wafer or an silicon carbide (SiC) wafer, for example.

Figure 4:
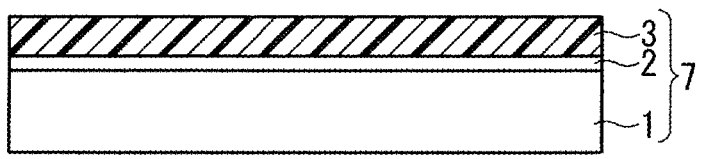
FIG. 4 A cross-sectional view illustrating the method of manufacturing the semiconductor element according to the embodiment 1.

The circuit element 2 includes a hollow bridge electrode connecting an electrode and an electrode, and although not illustrated in FIG. 3, there is a level difference caused by an electrode in an upper surface of the circuit element 2. A protection layer needs to be formed on the circuit element 2 to prevent breakage of the electrode in a subsequent polishing process. Thus, as illustrated in FIG. 4, an electrode protection layer 3 is applied and formed on the circuit element 2 (Step S1). The electrode protection layer 3 has an effect of protecting the electrode of the circuit element 2 in the subsequent polishing process, and also has an effect of flattening unevenness of the electrode, thereby increasing joint strength of joining the electrode protection layer 3 to the support substrate.

Selected for a material of the electrode protection layer 3 is an adhesive agent made up of an organic solvent and thermoset resin or photo-curable resin or a photoresist material which can be removed by a chemical treatment or oxide ashing in a final process. Generally used for the electrode protection layer 3 is acrylic resin, olefin resin, phenol resin, polypropylene resin, or polyethylene resin, for example. Effective for the electrode protection layer 3 is a material having substrate strength achieved by the circuit element substrate 7 and the support substrate integrated with each other and having a high degree of hardness preventing detachment or a crack, for example, in the polishing process, and from this viewpoint, a material having high film strength such as acrylic resin or epoxy resin is preferable.

Used for application of the electrode protection layer 3 is a spin-coating method of dropping an adhesive agent to a main surface of the circuit element substrate 7 on which the circuit element 2 is formed and rotating the circuit element substrate 7 at a high speed, for example. However, the other application method such as a printing method or a spray method may be used. The electrode protection layer 3 is formed to cover the circuit element 2 at a thickness of 5 μm to 8 μm. After the electrode protection layer 3 is applied on the circuit element 2, the electrode protection layer 3 is hardened. In a case where thermoset resin is used for the material of the electrode protection layer 3, the electrode protection layer 3 is heated to have a temperature of 90° C. to 120° C. by a hot plate, for example, thus a solvent component thereof evaporates and the electrode protection layer 3 is hardened. In a case where photo-curable resin is used for the material of the electrode protection layer 3, the circuit element substrate 7 is irradiated with light, thus the electrode protection layer 3 is hardened.

Figure 5:
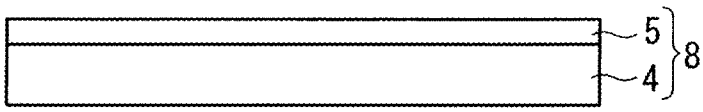
FIG. 5 A cross-sectional view illustrating the method of manufacturing the semiconductor element according to the embodiment 1.

Next, as illustrated in FIG. 5, a detachment layer 5 is formed on an adhesive surface of a transparent substrate 4 to prepare a support substrate 8 (Step S2). That is to say, the support substrate 8 includes the transparent substrate 4 and the detachment layer 5 formed on the transparent substrate 4. The transparent substrate 4 includes light transparency, and is made of alkali-free grass or sapphire glass. In a case where the support substrate 8 is detached from the circuit element substrate 7 in the subsequent process, it takes time when a method such as etching, polishing, or dipping in a detachment solution is applied. Thus, in the present embodiment, the detachment layer 5 made up of a photodecomposition material decomposed when absorbing light such as laser or infrared light is formed on the transparent substrate 4. For example, a paste made up of resin including a carbon material absorbing light, generating heat, and thermally decomposed and an organic solvent is applied to the transparent substrate 4 by a spin-coating method, and heat is applied to the paste to dry it, thus the detachment layer 5 is formed. A carbon film having a thickness of 1 μm to 2 μm as the detachment layer 5 may be formed on the transparent substrate 4 by a CVD sputtering device. When the carbon film is used for the detachment layer 5, the support substrate 8 can be firmly bonded to the circuit element substrate 7.

Mirror finishing is preferably performed on a surface of the detachment layer 5 by lap polishing. An arithmetic average roughness of the surface of the detachment layer 5 is preferably smaller than 0.5 nm, and is more preferably smaller than 0.2 nm. When the arithmetic average roughness of the surface of the detachment layer 5 is smaller than 0.5 nm, a portion which is not bonded to the circuit element substrate 7 in the subsequent process can be reduced, and bonding strength between the detachment layer 5 and the circuit element substrate 7 is increased.

Figure 6:
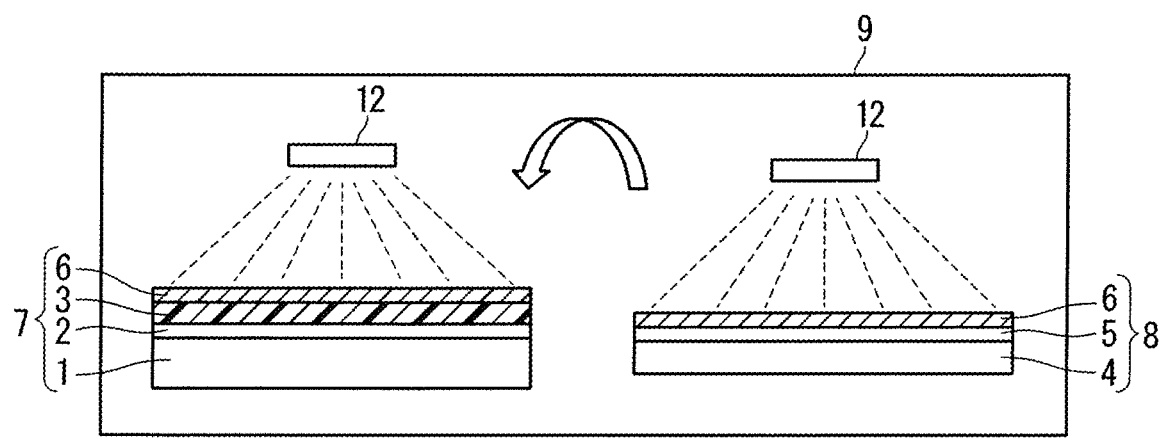
FIG. 6 A cross-sectional view illustrating the method of manufacturing the semiconductor element according to the embodiment 1.

Next, as illustrated in FIG. 6, the circuit element substrate 7 and the support substrate 8 are set in a vacuum chamber 9, and the vacuum chamber 9 is exhausted to an extremely-high vacuum $10^{-6}$ Pa. In this extremely-high vacuum state, a metal thin film 6 is formed to have a thickness of several nm to several tens of nm on the electrode protection layer 3 of the circuit element substrate 7 and the detachment layer 5 of the support substrate 8 by a sputtering method or an evaporation method, for example (Step S3). FIG. 6 illustrates sputtering atoms emitted from a sputtering target 12 on the electrode protection layer 3. Aluminum, copper, silicon, titanium, gold, silver, iron, or chrome, for example, is used for a material of the metal thin film 6.

Then, the metal thin films 6 are attached to each other in the vacuum chamber 9 to join the circuit element substrate 7 and the support substrate 8 (Step S4). The formation of the metal thin film 6 (Step S3) and the joining of the circuit element substrate 7 and the support substrate 8 (Step S4) are continuously performed in the same vacuum chamber 9. When the circuit element substrate 7 and the support substrate 8 are taken out to the air after the formation of the metal thin film 6, moisture, a natural oxide film, or an organic substance adheres to surfaces of the metal thin films 6, and the metal thin films 6 are not joined to each other. Thus, the circuit element substrate 7 and the support substrate 8 need to be irradiated with ion beam or neutral atomic beam in vacuum again and cleaned to attach the circuit element substrate 7 and the support substrate 8. In the meanwhile, applied in the present embodiment is an atomic diffusion joining method of forming the metal thin film 6 on the circuit element substrate 7 and the support substrate 8 in vacuum and subsequently attaching the metal thin films 6 to each other in vacuum, thus the surface activation needs not be performed by atomic beam, for example. Thus, there is no loss in the process, and a time for the joint process (Step S3 and Step S4) can be reduced to ten minutes to fifteen minutes. Accordingly, when a cassette capable of setting a plurality of wafers at one time and a load lock chamber as a spare exhaustion room is provided in the vacuum chamber 9, a time for the treatment can be reduced compared with a process of attaching the substrate using a general adhesive agent.

In a conventional technique using a wax or thermoset or photo-curable resin for bonding the circuit element substrate 7 and the support substrate 8, a thickness of the resin film is large, that is several hundred μm to several mm, and a degree of elasticity of the resin film is small. Thus, substrate strength is low after bonding, and such a configuration causes a problem that a crack occurs in a peripheral portion of the circuit element substrate 7 at a time of polishing and thinning the circuit element substrate 7 or the circuit element substrate 7 is detached from the support substrate 8. However, according to the atomic diffusion joining method of the present embodiment, the thickness of the bonding layer can be extremely thinned to be approximately 0.2 nm to 20 nm, that is equal to a size of one atom. In the atomic diffusion joining method, achieved is direct bonding in which atoms in the two substrates joined to each other are mutually diffused, thus bonding force is large, and mechanical strength of the joint substrate is increased. Thus, a defect such as a crack, detachment, or breakage at a time of polishing or dicing is reduced. According to the atomic diffusion joining method, the joint is performed at a normal temperature, thus the substrate is not thermally expanded by heat, thereby not being deflected. Thus, a material of the substrate to be joined is not limited.

Figure 7:
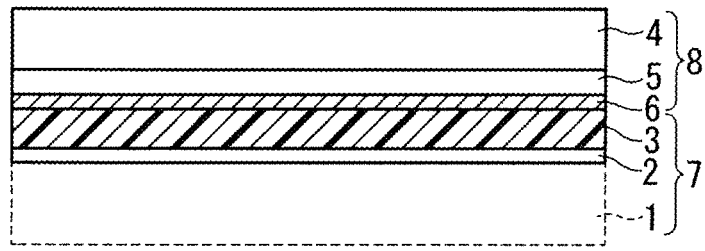
FIG. 7 A cross-sectional view illustrating the method of manufacturing the semiconductor element according to the embodiment 1.

Next, as illustrated in FIG. 7, a surface of the joint substrate, which is made up of the circuit element substrate 7 and the support substrate 8, on a side of the circuit element substrate 7 is polished, and the semiconductor substrate 1 is removed (Step S5). The semiconductor substrate 1 is removed to increase heat radiation efficiency of the circuit element 2, and obtain lower power consumption and high output. In the present step, the semiconductor substrate 1 having a thickness of 500 μm is polished to have a thickness of 20 μm firstly. Mechanical polishing, chemical polishing, or chemical mechanical polishing, for example, is applied to a polishing method. Next, the remaining semiconductor substrate 1 having a thickness of 20 μm is removed by dry etching such as reactive ion etching (RIE). Accordingly, the semiconductor substrate 1 is completely removed, and the lower surface of the circuit element 2 is exposed. Subsequently, chemical mechanical polishing is performed, and flatness of the lower surface of the circuit element 2 is obtained. In consideration of joining to the transfer substrate 10 which will be performed afterward, an arithmetic average roughness Ra of the lower surface of the circuit element 2 is preferably equal to or smaller than 0.5 nm.

As the semiconductor substrate 1 is gradually thinned by polishing, strength of the circuit element substrate 7 including the circuit element 2 decreases. Thus, the circuit element 2 is deformed by influence of stress of a remaining film, or a crack or detachment occurs in a peripheral portion of the circuit element 2 due to unevenness of polishing. However, in the present embodiment, the semiconductor substrate 1 is polished while the circuit element substrate 7 is firmly bonded to the support substrate 8, thus even when the semiconductor substrate 1 is removed, strength of the circuit element substrate 7 is maintained. Accordingly, a defect such as deformation, a crack, or detachment of the circuit element 2 is suppressed.

Figure 8:
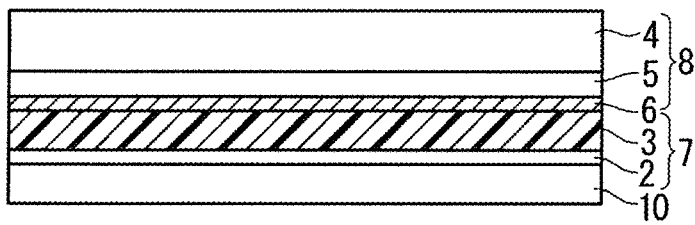
FIG. 8 A cross-sectional view illustrating the method of manufacturing the semiconductor element according to the embodiment 1.

Next, the lower surface of the circuit element 2 is joined to the transfer substrate 10 as illustrated in FIG. 8 (Step S6). A diamond substrate excellent in thermal conductivity, for example, is used for the transfer substrate 10. The transfer substrate 10 has a thickness of 100 μm, and an arithmetic average roughness of a joint surface is equal to or smaller than 0.5 nm by precision polishing. An atomic diffusion joining method which is the same as joining of the support substrate 8 described above is applied for joining of the transfer substrate 10. A thermal expansion coefficient of diamond constituting the transfer substrate 10 is $2.3 \times 10^{-6}$/K, and is significantly different from a thermal expansion coefficient of gallium nitride constituting the circuit element 2, that is $5.5 \times 10^{-6}$/K. Accordingly, it is difficult to thermally join the transfer substrate 10 to the circuit element 2. In the meanwhile, when the circuit element 2 and the transfer substrate 10 are directly joined by an extremely thin metal film having a thickness of several nm, thus a high heat radiation effect with small thermal resistance at a joint interface is obtained. Alternatively, the circuit element 2 and the transfer substrate 10 may be joined using a surface activating method of irradiating the joint surface with neutral atomic beam to remove a natural oxide film or an organic substance, and then attaching the joint surface. In this case, the joint surface between the circuit element 2 and the transfer substrate 10 is set to have an arithmetic average roughness of 0.5 nm or less by surface polishing.

Figure 9:
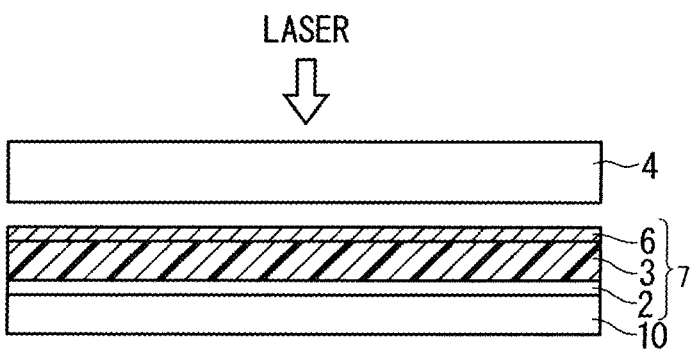
FIG. 9 A cross-sectional view illustrating the method of manufacturing the semiconductor element according to the embodiment 1.

Next, the support substrate 8 is detached from the circuit element substrate 7 as illustrated in FIG. 9 (Step S7). Particularly, laser is emitted from an upper surface of the transparent substrate 4 to heat and decompose the detachment layer 5, thereby detaching the support substrate 8. According to this method, the number of processes is reduced, a time for treatment is short, and the transparent substrate 4 can be reused compared with a method of removing the support substrate 8 by polishing or etching, thus productivity can be improved, and a manufacturing cost can be reduced.

Figure 10:
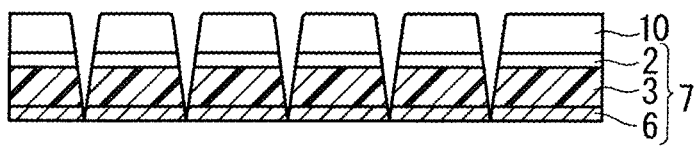
FIG. 10 A cross-sectional view illustrating the method of manufacturing the semiconductor element according to the embodiment 1.
Figure 11:
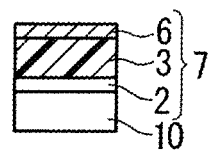
FIG. 11 A cross-sectional view illustrating the method of manufacturing the semiconductor element according to the embodiment 1.

Next, dicing is performed as illustrated in FIG. 10 and FIG. 11 to divide the joint substrate made up of the transfer substrate 10 and the circuit element substrate 7 into a plurality of chips (Step S8). FIG. 11 illustrates one chip after the division. A large number of elements are formed in the circuit element 2, and each element is divided in the present step. Laser dicing or plasma dicing, for example, can be applied to a dicing method. A crack, detachment, or a chip, for example, conventionally occurs in the circuit element substrate 7 in the dicing process due to reduction in strength in accordance with thinning thereof. However, in the present embodiment, strength is increased by directly joining the circuit element substrate 7 to the support substrate 8, thus the defect described above is suppressed.

Next, the metal thin film 6 and the electrode protection layer 3 are detached from the divided chips (Step S9). In the present step, the circuit element substrate 7 is dipped in alkali or acid detachment solution or organic solvent, for example, to dissolve the metal thin film 6 and the electrode protection layer 3 for removal. Then, a remaining organic substance is cleansed, and the circuit element substrate 7 is dried. Alternatively, it is also applicable that the metal thin film 6 is removed by an acid detachment solution, and the electrode protection layer 3 is removed by oxide ashing. In this manner, the semiconductor element 101 illustrated in FIG. 1 is completed.

A-3. Effect

As described above, according to the method of manufacturing the semiconductor element of the embodiment 1, the circuit element substrate 7 including the semiconductor substrate 1 and the circuit element 2 on the semiconductor substrate 1 are prepared, the electrode protection layer 3 is formed on the circuit element 2, the support substrate 8 is prepared, the metal thin film 6 is formed on the electrode protection layer 3 of the circuit element substrate 7 and the support substrate 8 in vacuum, the metal thin films 6 of the circuit element substrate 7 and the support substrate 8 are attached by an atomic diffusion joining method to join the circuit element substrate 7 and the support substrate 8, the semiconductor substrate 1 is removed by polishing to expose the circuit element 2, the transfer substrate 10 is joined to the exposed surface of the circuit element 2, and the support substrate 8 is detached from the circuit element 2 after joining the transfer substrate 10. The metal thin films 6 of the circuit element substrate 7 and the support substrate 8 are firmly bonded by the atomic diffusion joining method, thus mechanical strength of the joint substrate made up of the circuit element substrate 7 and the support substrate 8 joined to each other is increased. Accordingly, even when the semiconductor substrate 1 is polished to thin the semiconductor element, a defect such as a crack, detachment, or breakage hardly occurs in the circuit element 2, and a defect rate can be reduced.

B. Embodiment 2

B-1. Configuration

Figure 12:
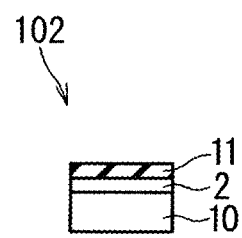
FIG. 12 A cross-sectional view illustrating a semiconductor element according to an embodiment 2.

FIG. 12 is a cross-sectional view of a semiconductor element 102 according to an embodiment 2. The semiconductor element 102 includes the circuit element 2, an inorganic insulating film 11 formed on the upper surface of the circuit element 2, and the transfer substrate 10 formed on the lower surface of the circuit element 2. The circuit element 2 and the transfer substrate 10 are as described in the embodiment 1. The inorganic insulating film 11 is an electrode protection layer. Although resin is used for the electrode protection layer 3 in the embodiment 1, an inorganic insulating film having high thermal conductivity is used as the electrode protection layer in the embodiment 2, thus is referred to as the inorganic insulating film 11.

When the inorganic insulating film is used for the electrode protection layer, strength of the joint substrate made up of the circuit element substrate 7 and the support substrate 8 is increased, and a crack or detachment after polishing the semiconductor substrate 1 can be suppressed. However, it is difficult to remove the electrode protection layer in a final process, and the circuit element 2 after removal is significantly damaged. The inorganic insulating film 11 is not removed but is used as a heat radiation material on a side of the upper surface of the circuit element 2 in the semiconductor element 102, thus a heat radiation property of the semiconductor element 102 is increased, and a process of removing the inorganic insulating film 11 is omitted. As described above, the inorganic insulating film 11 is used as the heat radiation material, thus the inorganic insulating film 11 is an inorganic insulating film having high thermal conductivity.

B-2. Manufacturing Process

Figure 13:
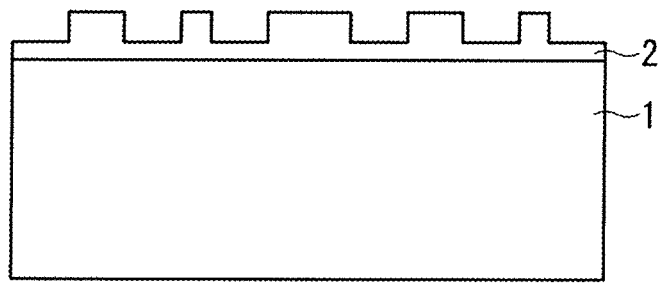
FIG. 13 A cross-sectional view illustrating a method of manufacturing the semiconductor element according to the embodiment 2.
Figure 14:
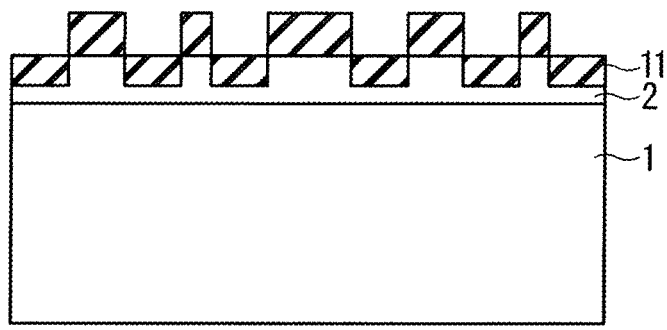
FIG. 14 A cross-sectional view illustrating the method of manufacturing the semiconductor element according to the embodiment 2.
Figure 15:
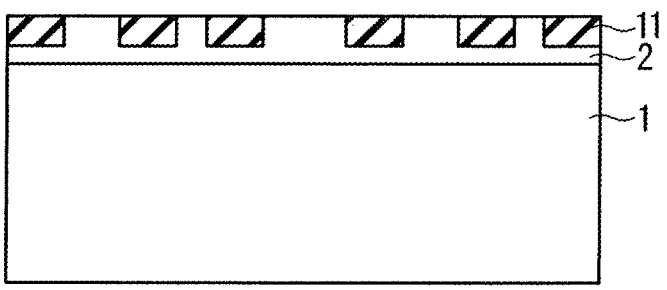
FIG. 15 A cross-sectional view illustrating the method of manufacturing the semiconductor element according to the embodiment 2.

FIG. 13 to FIG. 15 are cross-sectional views each illustrating the inorganic insulating film 11 as the electrode protection layer formed on the circuit element 2 of the circuit element substrate 7. FIG. 13 illustrates the semiconductor substrate 1 and the circuit element substrate 7 including the circuit element 2 on the semiconductor substrate 1. The circuit element 2 includes a hollow bridge electrode connecting an electrode and an electrode, thus a level difference is formed in the upper surface of the circuit element 2 as illustrated in FIG. 13. A height of the level difference is approximately several μm.

The circuit element substrate 7 is disposed in a layer formation device such as a CVD plasma device, and as illustrated in FIG. 14, the inorganic insulating film 11 having high thermal conductivity is formed on the circuit element 2 to have a thickness equal to or larger than a height of an electrode of the circuit element 2. Diamond, aluminum nitride, silicon nitride, or beryllium oxide, for example, can be used as a material of the inorganic insulating film 11. The inorganic insulating film 11 having high thermal conductivity is used as the electrode protection layer, thus the electrode protection layer can be used as a heat sink on a side of the upper surface of the circuit element 2, and the process of removing the electrode protection layer is unnecessary. Thus, reduction in time for the process and improvement of a device performance can be achieved.

Silicon oxide, for example, which is the insulating film but has low thermal conductivity needs to be removed in a final process by reason that it has a low heat radiation property and has a negative influence on the device performance. The circuit element 2 is damaged in the removal process, thus it is difficult to use a material such as silicon oxide as the material of the inorganic insulating film 11.

The electrode protection layer 3 according to the embodiment 1 is resin, thus when a spin-coating method is applied, the resin flows and the upper surface of the electrode protection layer 3 is flatly formed. However, when the inorganic insulating film 11 is formed by a CVD method, for example, a level difference occurs in the upper surface of the inorganic insulating film 11 as illustrated in FIG. 14. In order to obtain high bonding strength between the circuit element substrate 7 and the support substrate 8, the upper surface of the inorganic insulating film 11 needs to be flattened to bond the whole upper surface of the inorganic insulating film 11 to the support substrate 8. Thus, as illustrated in FIG. 15, a high portion of the inorganic insulating film 11 is flattened to have the same height as the electrode of the circuit element 2 by a polishing method. An arithmetic average roughness of the upper surface of the inorganic insulating film 11 at this time is equal to or smaller than 1.0 nm.

Next, after the upper surface of the inorganic insulating film 11 is cleansed to remove a polishing residue, performed in the manner similar to the embodiment 1 are formation of the metal thin film 6 (Step S3), joining of the circuit element substrate 7 (Step S4) and the support substrate 8 (Step S5), polishing of the semiconductor substrate 1 (Step S6), joining of the transfer substrate 10 (Step S7), detachment of the support substrate 8 (Step S8), and division of the circuit element 2 (Step S9). Then, the metal thin film 6 is removed from the upper surface of the inorganic insulating film 11, and the semiconductor element 102 illustrated in FIG. 12 is completed. The inorganic insulating film 11 remains on the upper surface of the circuit element 2, and functions as a heat sink.

B-3. Effect

In the method of manufacturing the semiconductor element according to the embodiment 2, the electrode protection layer formed on the upper surface of the circuit element 2 is the inorganic insulating film 11 made up of an inorganic insulating material. Accordingly, strength of the joint substrate made up of the circuit element substrate 7 and the support substrate 8 is increased compared with a case of using resin for the electrode protection layer, and a crack or detachment after polishing the semiconductor substrate 1 can be suppressed. When the inorganic insulating film 11 is an inorganic insulating film having high thermal conductivity, the inorganic insulating film 11 can be used not only as the electrode protection layer but also as a heat radiation material on the side of the upper surface of the circuit element 2. Accordingly, the heat radiation property of the semiconductor element 102 can be increased, and the process of removing the electrode protection layer can be omitted.

Each embodiment can be arbitrarily combined, or each embodiment can be appropriately varied or omitted. The foregoing description is in all aspects illustrative. It is therefore understood that numerous modification examples not illustrated can be devised.

EXPLANATION OF REFERENCE SIGNS

1 Semiconductor substrate, 2 circuit element, 3 electrode protection layer, 4 transparent substrate, 5 detachment layer, 6 metal thin film, 7 circuit element substrate, 8 support substrate, 9 vacuum chamber, 10 transfer substrate, 11 inorganic insulating film, 12 sputtering target, 101, 102 semiconductor element.

The invention claimed is:

1. A method of manufacturing a semiconductor element, comprising:
   preparing a circuit element substrate including a semiconductor substrate and a circuit element on the semiconductor substrate;
   forming an electrode protection layer on the circuit element;
   preparing a support substrate;
   forming a first metal thin film on the electrode protection layer of the circuit element substrate and a second thin film on the support substrate in vacuum;
   attaching the first metal thin film of the circuit element substrate and the second metal thin film of the support substrate by an atomic diffusion joining method, thereby joining the circuit element substrate and the support substrate;
   removing the semiconductor substrate by polishing to expose the circuit element;
   joining a transfer substrate to an exposed surface of the circuit element; and
   detaching the support substrate from the circuit element after joining the transfer substrate,
   wherein the forming of the first metal thin film, the second metal thin film, and the joining of the circuit element substrate and the support substrate are continuously performed in an identical vacuum chamber.

2. The method of manufacturing the semiconductor element according to claim 1, wherein:
   the support substrate includes a transparent substrate and a detachment layer including a photodecomposition material formed on the transparent substrate,
   the second metal thin film is formed on the detachment layer of the support substrate, and
   the support substrate is detached by performing photodecomposition on the detachment layer.

3. The method of manufacturing the semiconductor element according to claim 2, wherein:
   the detachment layer includes a carbon film, and
   the support substrate is detached by emitting laser from a lower surface of the transparent substrate, thereby heating and decomposing the detachment layer.

4. The method of manufacturing the semiconductor element according to claim 1, wherein;
   the electrode protection layer includes acrylic resin or epoxy resin.

5. The method of manufacturing the semiconductor element according to claim 1, wherein;
   the electrode protection layer includes an inorganic insulating material.

6. The method of manufacturing the semiconductor element according to claim 5, wherein:
   the inorganic insulating material is any of diamond, aluminum nitride, silicon nitride, or beryllium oxide.

7. The method of manufacturing the semiconductor element according to claim 1, wherein:

the circuit element includes gallium nitride as a semiconductor layer, and
the transfer substrate includes diamond.

\* \* \* \* \*